United States Patent [19]
Weiner et al.

[11] Patent Number: 5,866,963
[45] Date of Patent: Feb. 2, 1999

[54] BRIDGE RECTIFIER WITH INSULATING SUPPORT HAVING EXPANDABLE LEGS

[75] Inventors: Al Weiner, Miami, Fla.; Jimmy Shih, Taipei, Taiwan

[73] Assignees: Renard Manufacturing Co., Inc., Miami, Fla.; Kalem Technologies Corp., Taipei, Taiwan

[21] Appl. No.: 823,680

[22] Filed: Mar. 25, 1997

Related U.S. Application Data

[60] Provisional application No. 60/036,990, Jan. 30, 1997.

[51] Int. Cl.$^6$ .................................................. H02K 11/00
[52] U.S. Cl. ........................ 310/68 D; 310/71; 363/145
[58] Field of Search ..................... 310/68 D; 363/141, 363/145; 257/722; 361/709, 697, 703; 411/373

[56] References Cited

U.S. PATENT DOCUMENTS

| | | | |
|---|---|---|---|
| 3,638,073 | 1/1972 | Bernstein | 317/100 |
| 3,697,814 | 10/1972 | Christman et al. | 317/100 |
| 3,789,275 | 1/1974 | Sawano et al. | 317/234 R |
| 3,831,047 | 8/1974 | Sokol et al. | 310/68 D |
| 3,959,676 | 5/1976 | Striker | 310/68 D |
| 4,065,686 | 12/1977 | Moore | 363/145 |
| 4,137,560 | 1/1979 | Moore | 310/68 D |
| 4,189,653 | 2/1980 | Hiratuka et al. | 310/68 D |
| 4,604,538 | 8/1986 | Merrill et al. | 310/68 D |
| 4,606,000 | 8/1986 | Steele et al. | 363/145 |
| 4,835,427 | 5/1989 | Bohm et al. | 310/68 D |
| 4,952,829 | 8/1990 | Armbruster et al. | 310/68 D |
| 5,043,614 | 8/1991 | Yockey | 310/68 D |
| 5,233,246 | 8/1993 | Yockey | 310/68 D |
| 5,296,770 | 3/1994 | Pflueger et al. | 310/14 |
| 5,315,195 | 5/1994 | Bradfield et al. | 310/89 |
| 5,331,231 | 7/1994 | Koplin et al. | 310/68 D |
| 5,451,823 | 9/1995 | Deverall et al. | 310/68 D |
| 5,453,648 | 9/1995 | Bradfield | 310/71 |
| 5,473,208 | 12/1995 | Stihi | 310/68 D |
| 5,640,062 | 6/1997 | Yockey | 310/68 D |
| 5,646,838 | 7/1997 | Keidar et al. | 363/145 |
| 5,653,564 | 8/1997 | Nakamura | 411/373 |
| 5,659,212 | 8/1997 | DePetris | 310/68 D |

*Primary Examiner*—Nestor Ramirez
*Assistant Examiner*—K. Eizo I. Tamai
*Attorney, Agent, or Firm*—Shlesinger, Arkwright & Garvey LLP

[57] ABSTRACT

A bridge rectifier for an alternator comprises a first heat sink for being secured to a frame of an alternator; a second heat sink disposed on top of the first heat sink; an electrical insulator disposed between the first and second heat sinks; a first group of diodes operably secured to the first heat sink; a second group of diodes operably secured to the second heat sink; an insulating support operably secured to the second heat sink, the support including a plurality of legs adapted to be received in respective holes in the second heat sink; a plurality of screws adapted to be received axially by respective legs, the screws being adapted to expand the legs radially, thereby to lock the legs in respective holes; and a plurality of electrical connectors each being operably connected to a respective pair of diodes, each pair comprising a diode from the first group and a diode from the second group, each of the plurality of electrical connectors for being operably connected to the alternator, each of the plurality of electrical connectors being secured to the insulating support.

23 Claims, 6 Drawing Sheets

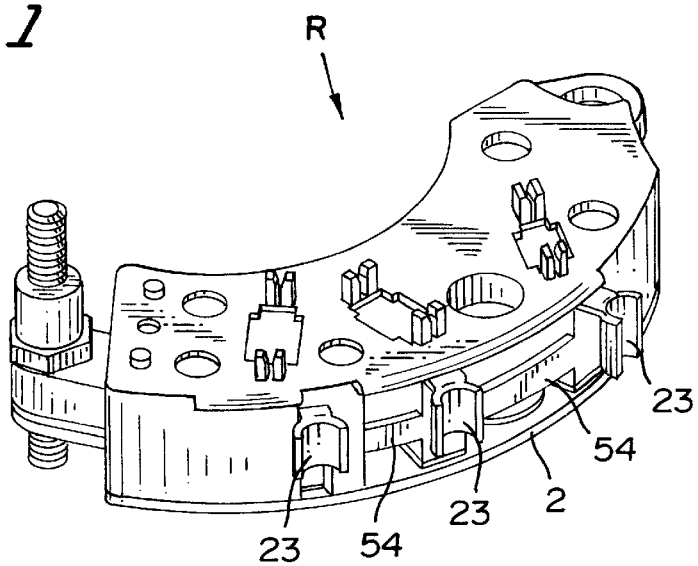
FIG. 1
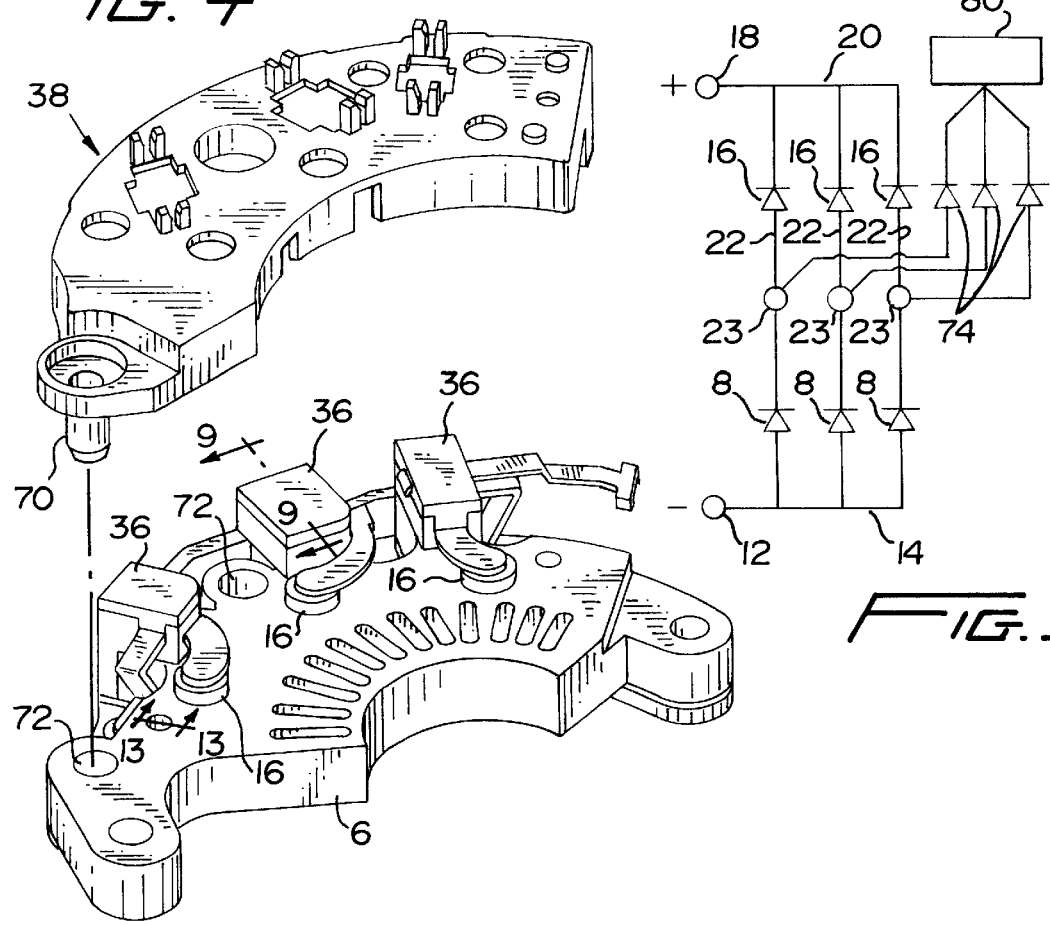
FIG. 4
FIG. 3

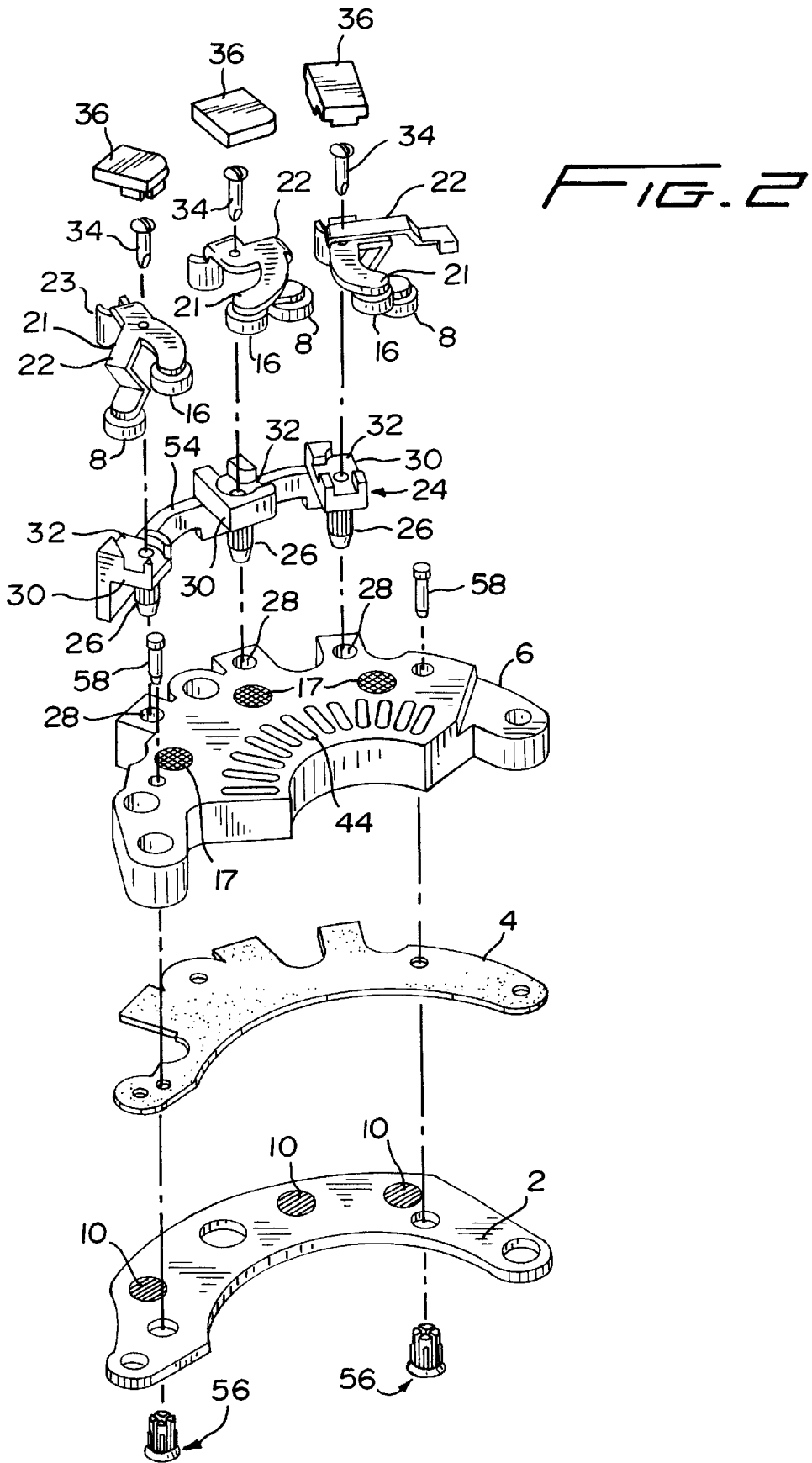

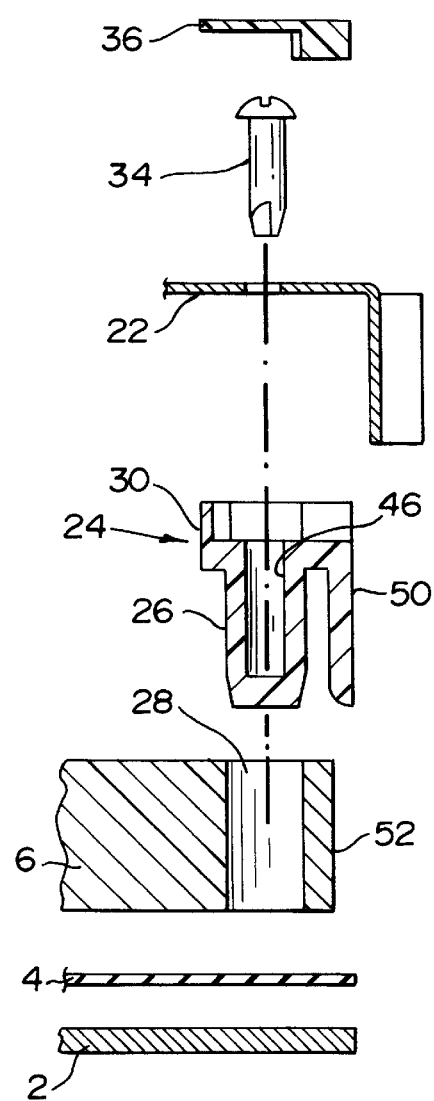
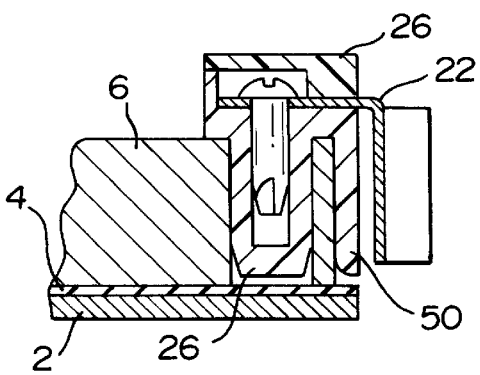
FIG. 10
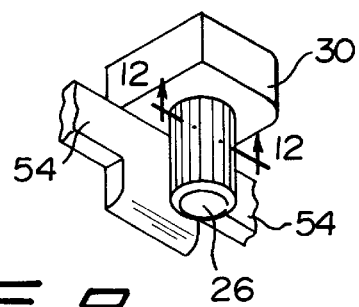
FIG. 11
FIG. 9
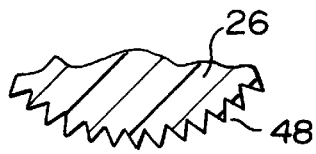
FIG. 12
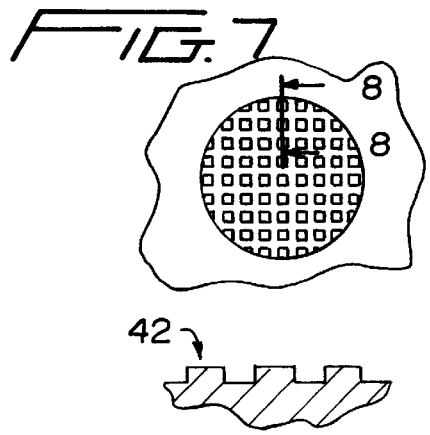
FIG. 7
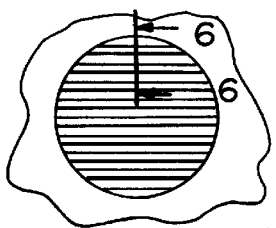
FIG. 5
FIG. 8 FIG. 6

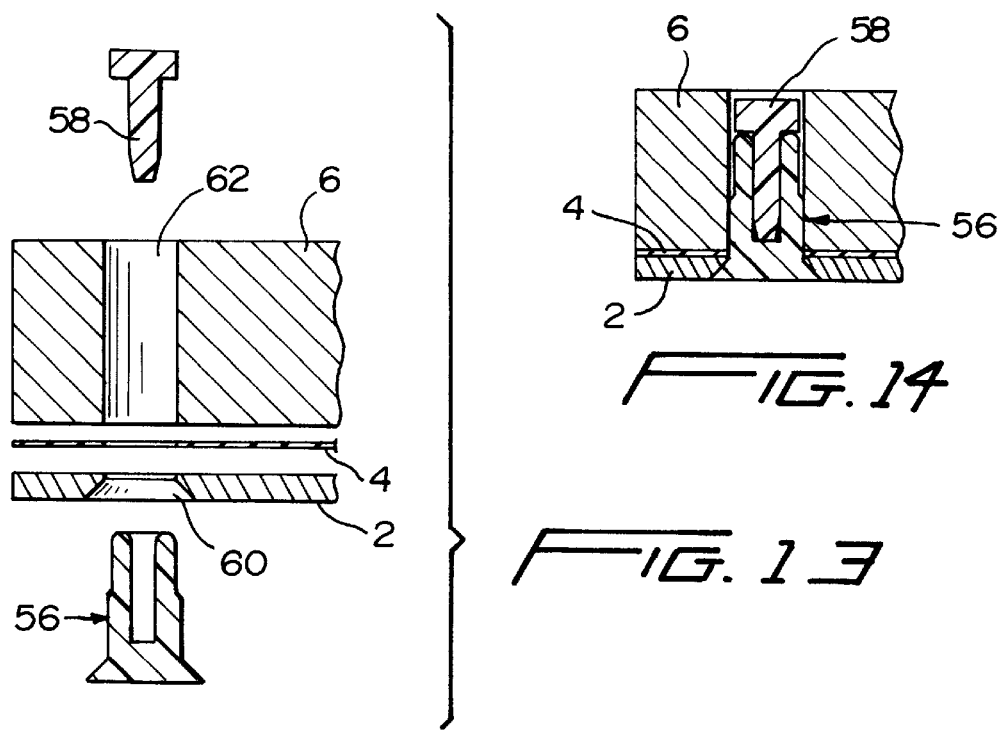
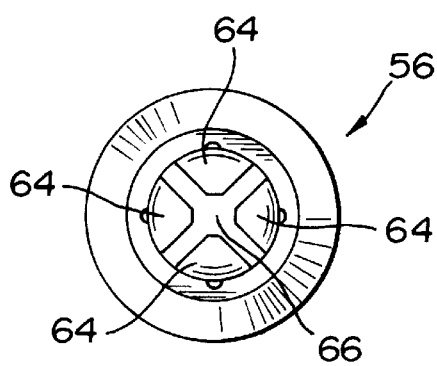
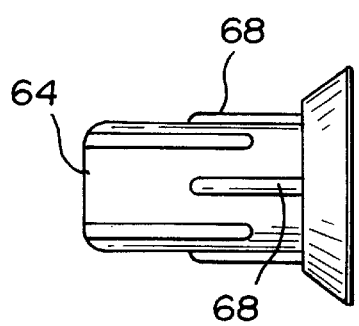
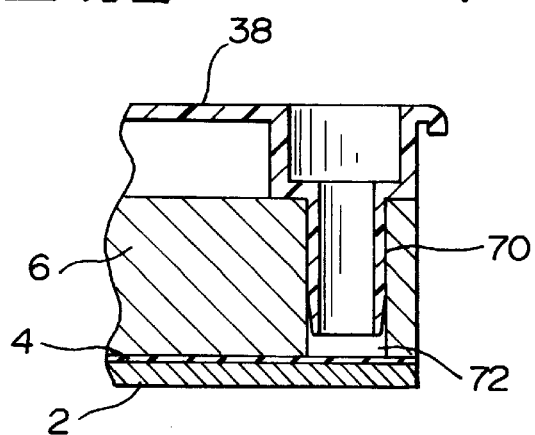

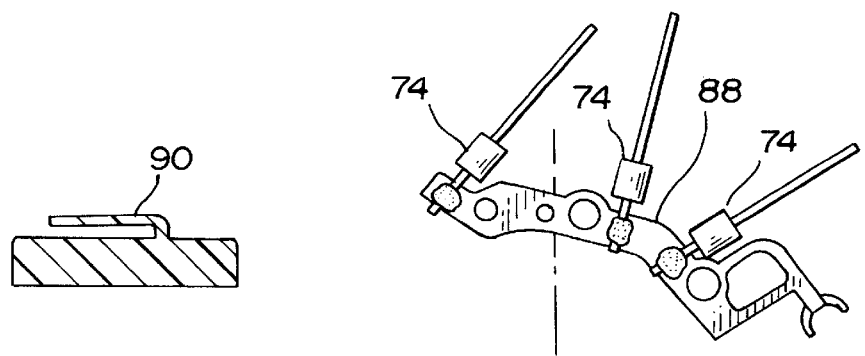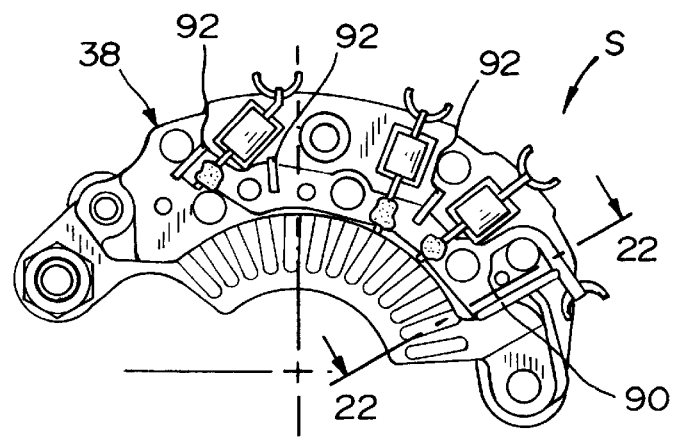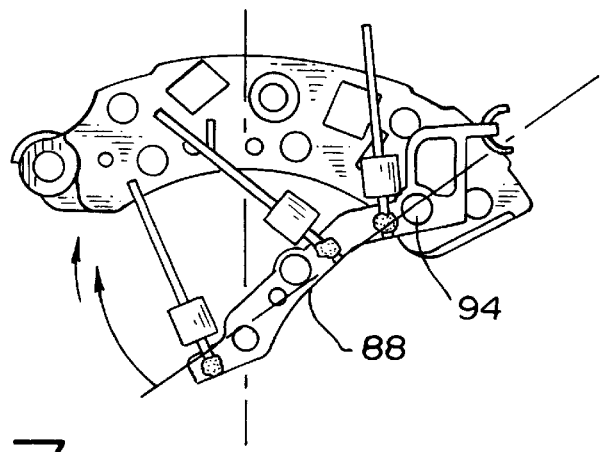

BRIDGE RECTIFIER WITH INSULATING SUPPORT HAVING EXPANDABLE LEGS

RELATED APPLICATION

This is a regular application based on a provisional application Ser. No. 60/036,990 filed on Jan. 30, 1997.

FIELD OF THE INVENTION

The present invention pertains generally to bridge rectifiers used for rectifying the alternating current output of an alternator used in vehicles, and particularly to bridge rectifiers with a single insulating support for a plurality of electrical connectors used to interconnect the diodes.

BACKGROUND OF THE INVENTION

Bridge rectifiers for automotive-type alternators are well known in the art. An example of a bridge rectifier is disclosed in U.S. Pat. No. 4,606,000. Generally, a bridge rectifier comprises two metallic heat sinks that are electrically insulated from a each other. Each heat sink carries a plurality of semiconductor diodes such that the heat sinks form respective positive and negative direct voltage output terminals. The diodes are grouped in pairs and are connected to respective output phase windings of the alternator.

OBJECTS AND SUMMARY OF THE INVENTION

It is an object of the present invention to provide a bridge rectifier that has relatively fewer number of parts for ease of manufacture and assembly.

It is another object of the present invention to provide a bridge rectifier with greater binding between the diodes and the respective heat sinks, thereby to increase heat dissipation.

It is still another object of the present invention to provide a bridge rectifier that provides better solderability for the diodes and more accurate diode positioning.

It is yet another object of the present invention to provide a bridge rectifier with a single insulating support for the electrical connectors used to connect the diodes for ease of assembly.

It is still another object of the present invention to provide the bridge rectifier with a single insulating support for the electrical connectors that is not cantilevered from the heat sink to which it is secured to minimize vibration during operation.

In summary, the present invention provides a bridge rectifier for an alternator, comprising a first heat sink for being secured to a frame of an alternator; a second heat sink disposed on top of the first heat sink; an electrical insulator disposed between the first and second heat sinks; a first group of diodes operably secured to the first heat sink; a second group of diodes operably secured to the second heat sink; an insulating support operably secured to the second heat sink, the support including a plurality of legs adapted to be received in respective holes in the second heat sink; a plurality of screws adapted to be received axially by respective legs, the screws being adapted to expand the legs radially, thereby to lock the legs in respective holes; and a plurality of electrical connectors each being operably connected to a respective pair of diodes, each pair comprising a diode from the first group and a diode from the second group, each of the plurality of electrical connectors for being operably connected to the alternator, each of the plurality of electrical connectors being secured to the insulating support.

These and other objects of the present invention will become apparent from the following detailed description.

BRIEF DESCRIPTIONS OF THE DRAWINGS

FIG. 1 is a perspective view of a bridge rectifier made in accordance with the present invention.

FIG. 2 is an exploded view of the rectifier of FIG. 1.

FIG. 3 is a schematic circuit diagram of the rectifier of FIG. 1.

FIG. 4 is a perspective view of the rectifier of FIG. 1, showing a plastic cover in exploded view.

FIG. 5 is an enlarged plan view of a predefined area for positive positioning of the negative diodes on the negative heat sink.

FIG. 6 is a cross-sectional view taken along lines 6—6 of FIG. 5.

FIG. 7 is an enlarged plan view of a predefined area for positive positioning of the positive diodes on the positive heat sink.

FIG. 8 is a cross-sectional taken along line 8—8 of FIG. 7.

FIG. 9 is an exploded view of a cross-section taken along line 9—9 in FIG. 4.

FIG. 10 is a cross-sectional view taken along line 9—9 in FIG. 4.

FIG. 11 is a bottom perspective view of one of the legs of the insulating support using the present invention.

FIG. 12 is a cross-sectional view taken along line 12—12 in FIG. 11.

FIG. 13 is an exploded view of a cross-section taken along line 13—13 in FIG. 4.

FIG. 14 is a cross-sectional view taken along line 13—13 in FIG. 4.

FIG. 15 is an enlarged end view of a female plug used in the present invention.

FIG. 16 is a side view of FIG. 15.

FIG. 17 is an enlarged cross-sectional view showing the attachment of the cover of the rectifier of FIG. 1 to the positive heat sink.

FIG. 20 is a plan view of another embodiment of a rectifier in accordance with the present invention.

FIG. 21 is diode assembly using a metal plate that is removably secured to the cover of the rectifier.

FIG. 22 is a cross-sectional view taken along line 22—22 of FIG. 20.

FIG. 23 is plan view of the assembly of FIG. 21 shown being secured to the cover in accordance with the present invention.

DETAILED DESCRIPTION OF THE INVENTION

Figure 18:
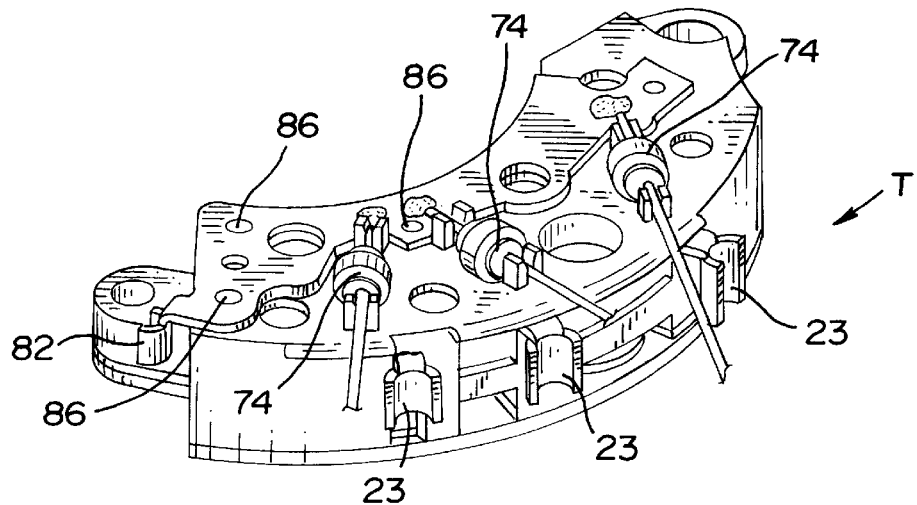
FIG. 18 is a perspective view of another embodiment of the rectifier of FIG. 1.
Figure 19:
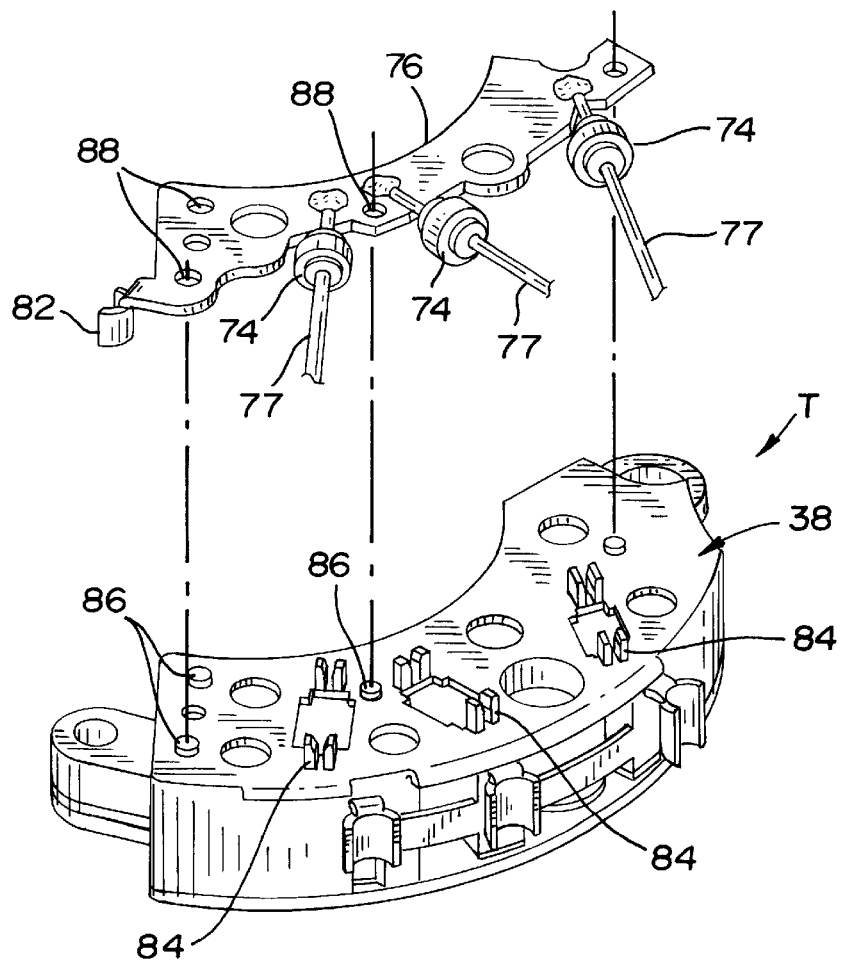
FIG. 19 is a perspective exploded view of the rectifier of FIG. 18.

A bridge rectifier R made in accordance with the present invention is disclosed in FIG. 1. The rectifier R is used to rectify the alternating output of an AC generator, such as that used in motor vehicles, to a DC output. The rectifier R includes a heat sink 2 adapted to be secured to a frame of the alternator. The heat sink 2 is preferably made of copper because of its good heat transfer and electrical conductivity properties. An insulating sheet 4 made from an insulating material, such as rubber, is disposed between the heat sink 2 and another heat sink 6 such that the heat sinks 2 and 6 are electrically insulated from each other, as best shown in FIG. 2. The heat sink 6 is preferably made of aluminum because of its good heat transfer and electrical conductivity properties.

A plurality of negative diodes 8 are secured to the heat sink 2, such as by soldering or brazing, at predefined areas 10. The anodes of the negative diodes 8 are thus connected together by the heat sink 2 to form the negative output terminal of the rectifier R, shown schematically at 12 in FIG. 3. The common connection provided by the heat sink 2 is schematically shown at 14 in FIG. 3.

A plurality of positive diodes 16 have their cathodes secured, such as by soldering or brazing, to the heat sink 6, as best shown in FIG. 4. The cathodes of the diodes 16 are therefore commonly connected by means of the heat sink 6 to form the positive output terminal 18 schematically shown in FIG. 3. A common connection for the cathodes of the diodes 16 is schematically shown at 20 in FIG. 3.

The positive diodes 16 are attached to the heat sink 6 to pre-defined areas 17 that advantageously provide for positive and accurate positioning of the diodes, thereby facilitating in the assembly process.

A plurality of electrical connectors 22 connect the cathode of one negative diode 8 to the anode of a respective positive diode 16 as best shown in FIGS. 2 and 3. The electrical connectors 22 are shown schematically in FIG. 3. Each connector 22 has a plurality of arms 21 adapted to be connected to the respective diodes 8 and 16, as best shown in FIG. 2, and a terminal 23 adapted to be connected to the alternating output of the alternator (not shown). The terminals 23 are shown schematically in FIG. 3.

A unitary insulating support 24 secured to the heat sink 6 in a manner that will be described below advantageously provides a stable and rigid support to the electrical connectors 22. The support 24 includes a plurality of legs 26 adapted to be received in respective holes 28 in the heat sink 6. The support 24 includes a plurality of flange members 30 provided with respective recesses 32 in which respective electrical connectors 22 are received. A plurality of self-tapping screws 34 secure the respective electrical connectors 22 to the support 24 and further lock the support 24 to the heat sink 6, as will be explained below. A plurality of covers 36 are secured to the respective flange members 30 to cover the screws 34.

A plastic cover 38 is disposed over the heat sink 6 to protect the connectors and diodes and provide a finished appearance to the assembly.

Each of the areas 10, shown in an enlarged plan view in FIG. 5, is provided with a plurality of grooves 40 for increased binding and contact between the heat sink 2 and the respective negative diode 8 to provide increased heat dissipation. The grooves 40 have been found to work effectively with the copper material used for the heat sink 2. The areas 10 advantageously provide for positive and accurate positioning of the diodes, thereby facilitating in the assembly of the diodes to the heat sink 2.

Each of the pre-defined areas 17, shown in an enlarged plan view in FIG. 6, is provided with a plurality of depressions 42 arranged in a grid fashion, similar to waffle-like structure for increased binding and contact of the respective positive diode 16 to the heat sink 6 to provide increased heat dissipation. The areas 17 advantageously provide for positive and accurate positioning of the diodes 16 to the heat sink 6, thereby facilitating in the assembly process.

The heat sink 6 is provided with a plurality of air passageways 44 to allow circulating air to cool down the rectifier assembly.

The attachment of the support 24 to the heat sink 6 is disclosed in FIGS. 9. Each of the legs 26 is fitted into the respective hole 28. An axial hole 46 in each leg 26 is adapted to receive the respective screw 34. Each leg 26 is provided with a plurality of longitudinal grooves 48, as best shown in FIG. 12, that are adapted to be crushed against the inner wall of the hole 46 when the screw 34 is driven into the leg 26. The screw 34 is adapted to expand the leg 26 outwardly against the wall of the hole 28, thereby crushing the grooves 48 and locking the support 24 to the heat sink 6. A plurality of members 50 extending downwardly from the respective flange members 30 prevent the respective leg 26 from rotating within the hole 28 the respective screw thirty-four is turned. Each member 50 engages a flat side wall 52 of the heat sink 6 such that rotation is prevented, as best shown in FIG. 10. A plurality of connecting members 54 (shown in FIG. 1) interconnect adjacent members 50 with each other, thereby advantageously providing additional rigidity against vibration and increased mass of the support 24 for effective heat transfer during use. Each flange member 30 sits squarely and is fully supported on its underside by the heat sink 6, avoiding any cantilever portion that could be subject to vibration during use, thereby minimizing premature failure.

Each recess 32 is shaped to the specific contour of the respective electrical connector 22 to precisely position the electrical connector when being secured to the respective flange member 30.

A female plug 56 and a cooperating male plug 58 are used to join the heat sink 2 to the heat sink 6 with the insulating member 4 sandwiched therebetween, as best shown in FIG. 13 and 14. A countersunk hole 60 in the heat sink 2 and an aligned hole 62 in the heat sink 6 are adapted to receive the plugs 56 and 58. The plug 56 includes a plurality of legs 64 defining a central opening 66 that is adapted to receive the plug 58. Longitudinal ribs 68 are adapted to press against the inner wall of the opening 62 when the plug 58 is forced into the opening 66, thereby locking the plug 56 in place.

The cover 38 is secured to the heat sink 6 by means of at least two legs 70 (one shown in FIG. 4) that are received in respective holes 72 in the heat sink 6, as best shown in FIG. 17. Adhesives or other standard means can used to secure the legs 70 within their respective holes.

Another embodiment of a rectifier T made in accordance with a present invention is disclosed in FIG. 18. The rectifier T is similar to the rectifier R, except that three additional diodes 74 are provided whose cathodes are commonly connected together through a metal plate 76, as best shown in FIG. 18. The anodes 77 of the diodes 74 are connected to respective phase terminals of the alternator (not shown) through the terminals 23 of the electrical connectors 2. The metal plate 76 is connected to a voltage regulator 80 at a connecting portion 82. The diodes 74 are shown schematically in FIG. 3. The cover 38 includes a plurality of cradles 84 adapted to receive the terminals of the respective diodes 74 as best shown in FIG. 18. Plastic stubs 86 are received in respective holes 88 in the metallic plate 76, thereby to secure the plate to the cover 38.

Still another embodiment of a rectifier S is disclosed in FIG. 20. The rectifier S is similar to rectifier T, except that a metal plate 88 shown in FIG. 21 is removably secured to the cover 38 by a plurality of hold-down clips 90 and 92. The hold-down clip 90 is shown in cross-section in FIG. 22 and is similar to the other hold-down clips 92. In assembly, the metal plate 88 is rotatably secured to the cover 38 at pivot 94, as best shown in FIG. 23 and rotated thereat until the metal plate 88 is engaged under the clips 90 and 92, as best shown in FIG. 20. Standard means such as screws hold the metal plate 88 securely in place.

The rectifier S provides the advantage of a removable assembly, comprising the metal plate 88 and the diodes 74, for replacement.

While this invention has been described as having preferred design, it is understood that it is capable of further modification, uses and/or adaptations following in general the principle of the invention and including such departures from the present disclosure as come within known or customary practice in the art to which the invention pertains, and as may be applied to the essential features set forth, and fall within the scope of the invention or the limits of the appended claims.

We claim:

1. A bridge rectifier for an alternator, comprising:
   a) a first heat sink for being secured to a frame of an alternator;
   b) a second heat sink disposed on top of said first heat sink, said second heat sink including a plurality of holes;
   c) an electrical insulator disposed between said first and second heat sinks;
   d) a first group of diodes operably secured to said first heat sink;
   e) a second group of diodes operably secured to said second heat sink;
   f) an insulating support operably secured to said second heat sink, said support including a plurality of legs adapted to be received in respective holes in said second heat sink;
   g) a plurality of screws adapted to be received axially in a respective well in each of said plurality of legs, said screws being adapted to expand said legs radially, thereby to lock said legs in respective holes; and
   h) a plurality of electrical connectors each being operably connected to a respective pair of diodes, each pair comprising a diode from said first group and a diode from said second group, each of said plurality of electrical connectors for being operably connected to the alternator, each of said plurality of electrical connectors being removably secured to said insulating support by said plurality of screws.

2. A rectifier as in claim 1, wherein:
   a) each of said legs includes longitudinal grooves.

3. A rectifier as in claim 1, wherein:
   a) said insulating support has a plurality of recesses; and
   b) each of said connectors is disposed in respective recess.

4. A rectifier as in claim 1, wherein:
   a) each of said connectors has a plurality of arms.

5. A rectifier as in claim 4, wherein:
   a) said plurality of arms are operably connected to respective pair of diodes.

6. A rectifier as in claim 1, wherein:
   a) said first heat sink includes a plurality of predefined areas provided with grooves; and
   b) said first group of diodes are secured to respective predefined areas.

7. A rectifier as in claim 6, wherein:
   a) said first heat sink is copper.

8. A rectifier as in claim 1, wherein:
   a) said second heat sink includes a plurality of predefined areas provided with indentations; and
   b) said second group of diodes are operably secured to respective predefined areas.

9. A rectifier as in claim 8, wherein:
   a) said second heat sink is aluminum.

10. A rectifier as in claim 1, wherein:
    a) said insulating support includes a plurality of flange members disposed at respective end portions of said legs; and
    b) a member connecting said flange members together.

11. A rectifier as in claim 10, wherein:
    a) said second heat sink including a side wall; and
    b) said insulating support includes a plurality of members secured to respective flange and spaced apart from respective legs, said plurality of members adapted to engage the side wall of said second heat sink when said legs are disposed within respective holes such that said legs are prevented from rotating within respective holes.

12. A rectifier as in claim 11, wherein:
    a) said connecting member is joined to said plurality of members.

13. A rectifier as in claim 10, and further comprising:
    a) plurality of covers secured to respective flange members.

14. A rectifier as in claim 3, and further comprising:
    a) plurality of covers are secured within respective recesses.

15. A rectifier as in claim 1, and further comprising:
    a) a cover disposed over said second group of diodes.

16. A rectifier as in claim 1, wherein:
    a) said insulating support is molded plastic.

17. A rectifier as in claim 1, wherein:
    a) said first and second heat sinks include indentations disposed below respective diodes.

18. A bridge rectifier for an alternator, comprising:
    a) a first heat sink for being secured to a frame of an alternator;
    b) a second heat sink disposed on top of said first heat sink;
    c) an electrical insulator disposed between said first and second heat sinks;
    d) a first group of diodes operably secured to said first heat sink;
    e) a second group of diodes operably secured to said second heat sink;
    f) an insulating support operably secured to said second heat sink, said support including means for securing to said second heat sink said securing means including a plurality of legs extending from said insulating support, said legs mating a plurality of holes in said second heat sink, each said leg having a well which axially receives a screw, said screw expanding said leg radially to thereby lock said leg in a respective hole,; and
    g) a plurality of electrical connectors each being operably connected to a respective pair of diodes, each pair comprising a diode from said first group and a diode from said second group, each of said plurality of electrical connectors for being operably connected to the alternator, each of said plurality of electrical connectors being removably secured to said insulating support.

19. A rectifier as in claim 18, and further comprising:
a) a metal plate; and
b) a third group of diodes operably connected to said metal plate and said first and second groups of diodes, said third group of diodes for connecting to a voltage regulator.

20. A rectifier as in claim 19, and further comprising:
a) a cover disposed over said second group of diodes; and
b) said metal plate is removably secured to said cover.

21. A rectifier as in claim 18, wherein:
a) said first and second heat sinks include indentations disposed below respective diodes.

22. A rectifier as in claim 21, wherein:
a) said indentations comprise grooves.

23. A rectifier as in claim 21, wherein:
a) said indentations comprise a plurality of depressions arranged in a grid.

* * * * *